United States Patent
Sumi et al.

(10) Patent No.: US 6,356,352 B1
(45) Date of Patent: Mar. 12, 2002

(54) COMPONENT MOUNTER AND MOUNTING METHOD

(75) Inventors: Hideki Sumi; Takahiro Noda; Kazuhiko Nakahara, all of Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/631,039

(22) Filed: Aug. 1, 2000

(30) Foreign Application Priority Data

Aug. 3, 1999 (JP) .......................... 11-219732

(51) Int. Cl.⁷ .................. G01B 11/14; B23P 19/00
(52) U.S. Cl. .................. 356/614; 29/740; 29/721; 29/700
(58) Field of Search .................. 356/614, 622; 348/94, 95, 126; 29/832, 740, 721, 741, 700, 834

(56) References Cited

U.S. PATENT DOCUMENTS

| | | | | |
|---|---|---|---|---|
| 5,086,556 A | * | 2/1992 | Toi | 29/740 |
| 6,000,123 A | * | 12/1999 | Munezane et al. | 29/740 |
| 6,041,494 A | * | 3/2000 | Mimura et al. | 29/832 |
| 6,230,393 B1 | * | 5/2001 | Hirano et al. | 29/740 |

* cited by examiner

*Primary Examiner*—Hoa Q. Pham
(74) *Attorney, Agent, or Firm*—Ratner & Prestia

(57) ABSTRACT

A component mounter which includes a component feeder carriage; mounting head having two or more suction nozzles for picking up a component from the feeder carriage; image capturing means for taking an image of each component held by the suction nozzles; and a recognizer for recognizing each component based on image data obtained by the image capturing means according to a mounting sequence of each component. Each component is immediately and individually mounted on a mounting target after recognition. This configuration allows to eliminate wasteful standby time, thus offering efficient component mounting.

14 Claims, 5 Drawing Sheets

COMPONENT MOUNTER AND MOUNTING METHOD

FIELD OF THE INVENTION

The present invention relates to component mounters and mounting methods such as for picking up electronic components from a component feeder carriage and mounting them on a substrate.

BACKGROUND OF THE INVENTION

A typical component mounter for mounting electronic components on a substrate picks up components stored in a feeder carriage with its mounting head provided with a suction nozzle, transfers them to above the substrate, and mounts them at predetermined mounting points. Before mounting components on the substrate, components are recognized to check their type and any positional deviation. This recognition is implemented by capturing the image of a component held with the mounting head by a camera installed underneath before the mounting operation.

Some mounters have a mounting head equipped with two or more suction nozzles for improving the mounting efficiency. This type of mounting head with multiple suction nozzles allows the picking up of two or more components when moving to the feeder carriage and picking up components to increase the efficiency of the pick-up process. After picking up the components, the mounting head moves over the camera to allow component recognition, at which point the image of each component is captured and recognized. Each component is then sequentially mounted at their predetermined mounting points on the substrate while correcting any detected positional deviation.

Conventionally, however, recognition is executed for all components held by the mounting head before starting to mount them on the substrate when using a mounting head with multiple nozzles to mount multiple components. This requires considerable time to recognize all the components, particularly if the number of components held by the head increases. Since no mounting takes place during recognition, this extends the overall mounting tact time. Accordingly, to improve the mounting efficiency, it is necessary to eliminate this wasteful time during recognition.

SUMMARY OF THE INVENTION

The present invention aims to provide a component mounter and mounting method for efficiently mounting components using a mounting head with multiple nozzles.

The component mounter of the present invention includes:

(a) a component feeder carriage;

(b) a mounting head having two or more suction nozzles for picking up components from the feeder carriage;

(c) image capturing means for taking the image of each component held with the suction nozzles; and (d) recognizer for recognizing each component using image data obtained through the image capturing means in accordance with a mounting sequence of each component.

Each component is mounted on a mounting target (such as substrate), one by one, after recognition.

This configuration allows to eliminate a wasteful standby time for improving the component mounting efficiency.

The component mounting method of the present invention includes the next steps:

(a) picking up components from the feeder carriage using the mounting head with two or more suction nozzles;

(b) capturing the image of each component held with the suction nozzles by the image capturing means;

(c) recognizing each component, according to its mounting sequence, using the captured image in accordance with a mounting sequence by a recognizer; and (d) mounting the recognized component, one by one onto the mounting target (such as a substrate).

In this method, each component is recognized according to its mounting sequence after capturing images. of multiple components. Then, the recognized component is mounted on the substrate immediately. This allows to start the mounting operation without waiting for recognition of all components picked up. Consequently, the efficiency of the component mounting process improves by the elimination of wasteful standby time.

DETAILED DESCRIPTION OF THE INVENTION

A preferred embodiment of the present invention is described below with reference to drawings.

Figure 1:
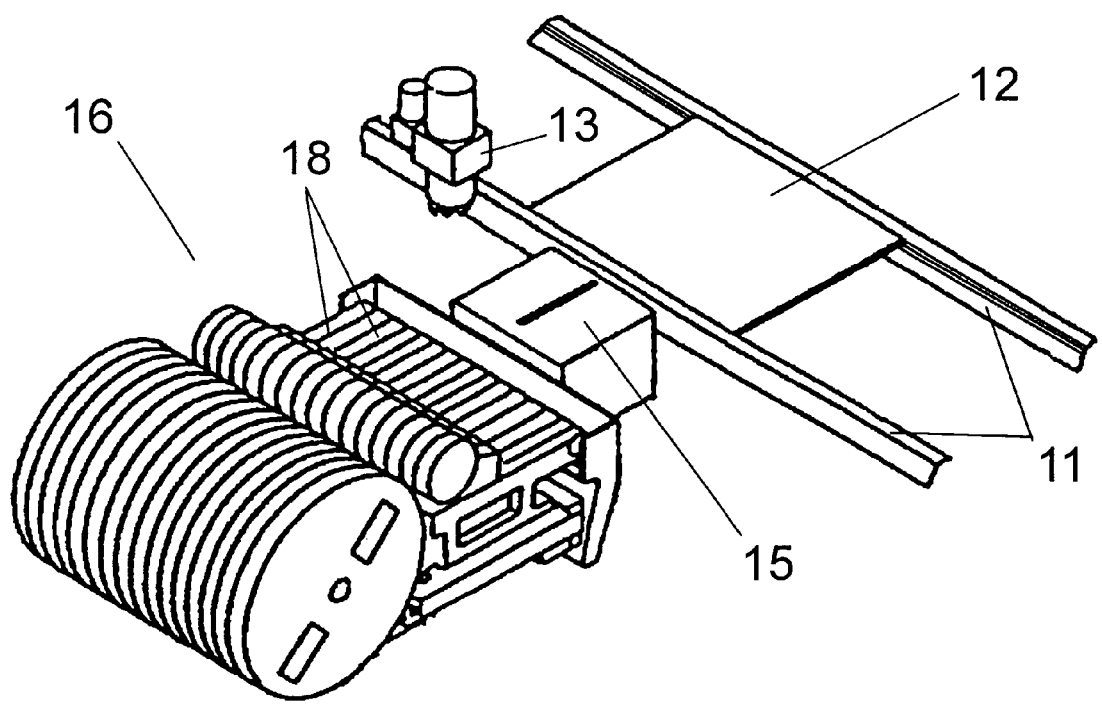
FIG. 1 is a perspective view of a component mounter in accordance with a preferred embodiment of the present invention.
Figure 2:
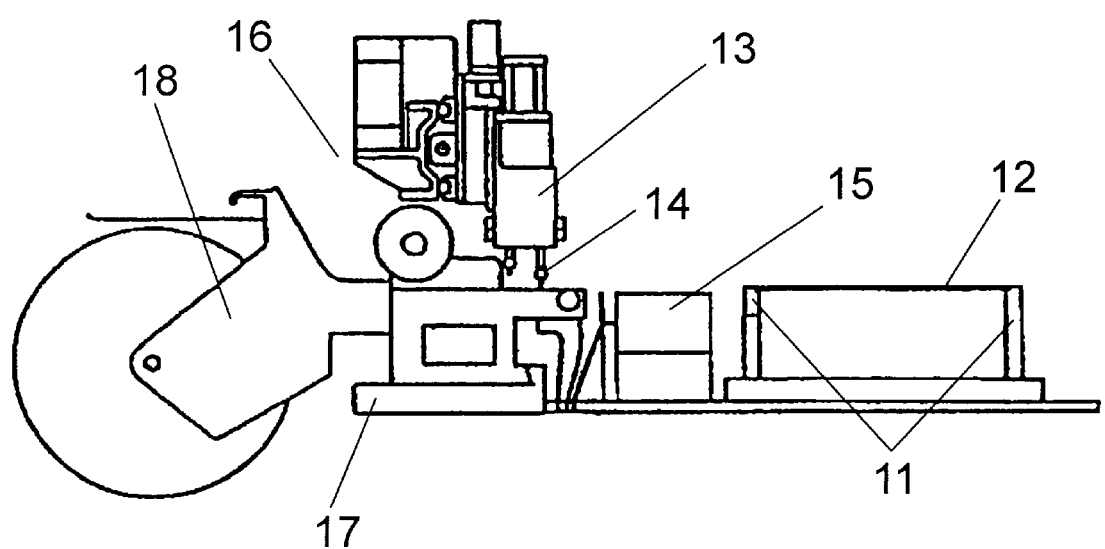
FIG. 2 is a sectional side view of the component mounter in accordance with the preferred embodiment of the present invention.
Figure 3:
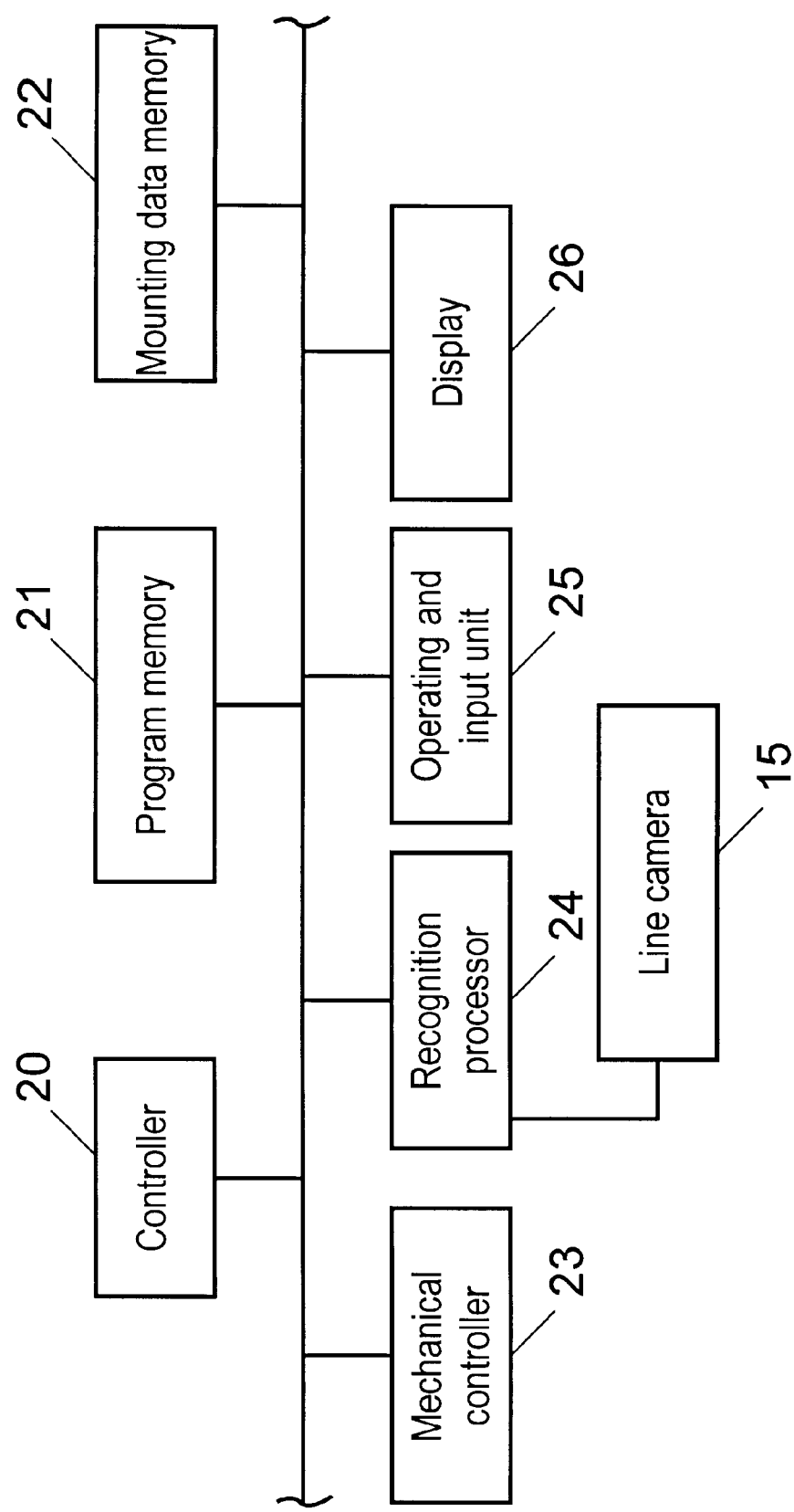
FIG. 3 is a block diagram of a control system in accordance with the preferred embodiment of the present invention.
Figure 4:
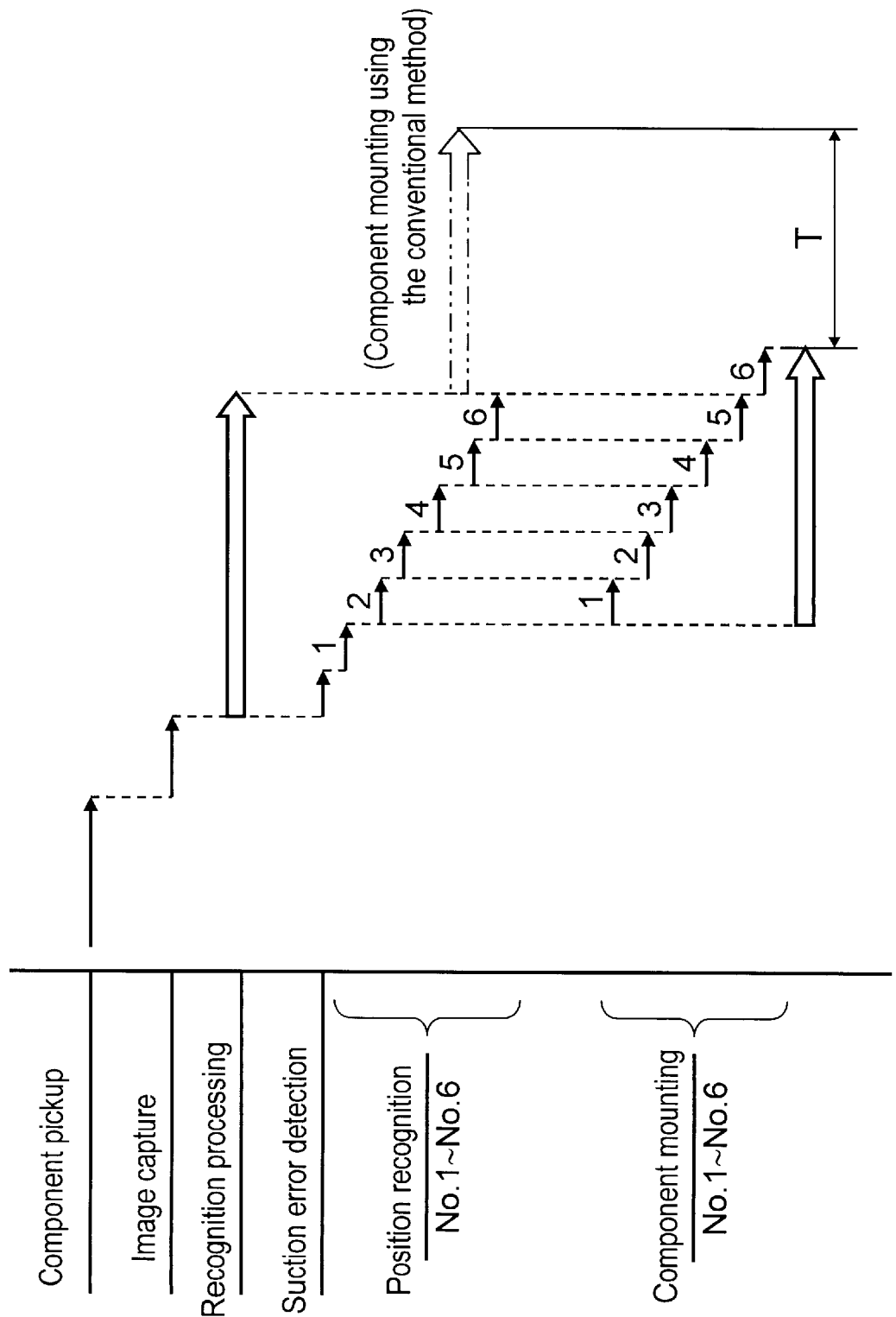
FIG. 4 is a timing chart for the mounting operation of the component mounter in accordance with the preferred embodiment of the present invention.
Figure 5:
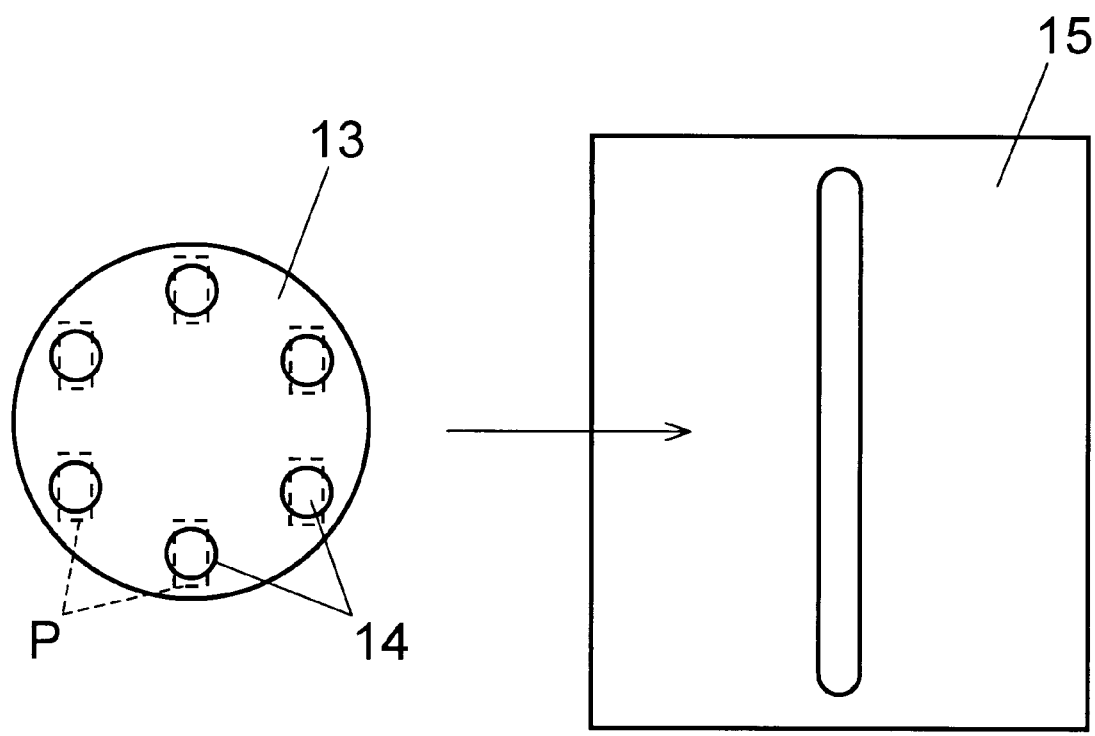
FIG. 5 illustrates how an image is captured in the component mounter in accordance with the preferred embodiment of the present invention.

FIG. 1 is a perspective view and FIG. 2 is a sectional side view of a component mounter in the preferred embodiment of the present invention. FIG. 3 is a block diagram of a control system in a component mounter in the preferred embodiment. FIG. 4 is a timing chart for the mounting operation of the component mounter in the preferred embodiment. FIG. 5 illustrates how an image is captured in the component mounter in the preferred embodiment of the present invention.

The configuration of the component mounter in the preferred embodiment of the present invention is described below.

In FIG. 1, substrate 12 is placed on transfer rail 11. Feeder carriage 16 that supplies electronic components is installed at the side of transfer rail 11. As shown in FIG. 2, two or more tape feeders 18 are placed on feeder base 17 of feeder carriage 16. Tape feeders 18 feed the tape holding components at a predetermined pitch to supply components to the pick-up position of mounting head 13.

Head 13 is moved horizontally by a driver (not illustrated), and two or more suction nozzles 14 installed at the bottom end of the head 13 pick up components from tape feeders 18 and mount them on substrate 12, which is the mounting target. Line camera 15, the image capturing means, is disposed between feeder carriage 16 and transfer rail 11. Camera 15 captures an image of each component held with nozzle 14 when head 13 holding the component with its nozzle 14 is moved over camera 15.

Next, the configuration of the control system of the component mounter in the preferred embodiment of the present invention is described with reference to FIG. 3. In FIG. 3, controller 20 is the CPU which controls the entire operation of the component mounter. Program memory 21 stores the programs required for a range of operations, including mounting operation. Mounting data including information on types, mounting sequence, and mounting coordinates of each component to be mounted on substrate 12 are stored in mounting data memory 22. Mechanical controller 23 controls motors for driving the XY table mechanism for moving the mounting head 13 and the conveyor mechanism of transfer rail 11.

Recognizer 24, which is the recognition means, recognizes the position of the component held by mounting head 13 using the image data obtained by line camera 15. Operating and input unit 25 is typically a keyboard or touch panel, and this is used for inputting control commands and data. Display 26 is a monitor for displaying the images captured by camera 15 and the operating menu.

The mounting operation of the component mounter of the preferred embodiment as configured above is described next following the chart in FIG. 4. The chart shows the sequence of steps and their timing while head 13 makes a single round trip between feeder carriage 16 and substrate 12 (one mounting turn).

First, head 13 moves to feeder carriage 16, and picks up one component with each one of multiple nozzles 14 (6 nozzles in the preferred embodiment). The types of the six components to be picked up and which component nozzle 14 will pick up are determined based on the mounting data previously stored in mounting data memory 22. In other words, each nozzle 14 picks up and mounts a predetermined component according to a predetermined mounting sequence.

Mounting head 13, holding six components by its nozzles 14 by suction, horizontally moves over camera 15 as shown in FIG. 5. While head 13 moves, camera 15 captures an image of each component P held by each nozzle 14. The captured image data is sent to recognizer 24 for recognition.

In the recognition process, firstly any suction error is detected. At this point, an image of component P on each nozzle 14, in other words, the presence of a component on each nozzle in the captured image is checked. If component P is missing from any of nozzles 14, the recognizer 24 determines it as a suction error of detected nozzle 14. In this case, no position recognition and component mounting operation, which are normally the next steps, are implemented for this particular nozzle 14.

After detection of suction errors, the position of the first component, i.e. the component which is to be mounted first in the sequence of mounting data for the six components picked up during one pickup operation, is recognized. After recognizing the position of the first component, the other components are also recognized one by one in the same way, in accordance with the predetermined mounting sequence.

After the position of the first component is recognized, head 13 starts to mount the first recognized component based on the mounting data. The required compensation for correcting positional deviation is calculated based on the position recognition result already obtained, and the first component is mounted on substrate 12 after correcting any positional deviation while the head moves over substrate 12.

During this component mounting operation, the recognizer 24 continues to recognize the positions of other components. Then, in the same way, the components whose position is already recognized are mounted in turn. Mounting of all components in the one mounting turn is complete after recognizing the position of the sixth component and mounting it on the substrate.

For comparison, FIG. 4 shows a part of the timing chart for the component mounting operation using the conventional method. It is apparent in FIG. 4 that the preferred embodiment allows reduction of the tact time indicated by time T, compared to the conventional method which starts the entire mounting operation only after the positions of all components are recognized in each mounting turn.

As described above, the present invention allows images of multiple components to be captured, an image of each component using captured image data to be recognized according to the component mounting sequence, and each recognized component to be mounted immediately and individually on the substrate without waiting for the completion of recognition of all components picked up before starting the mounting operation. Consequently, the present invention eliminates wasteful standby time and increases the efficiency of the electronic components mounting process.

What is claimed is:

1. A component mounter comprising:
   (a) a component feeder carriage;
   (b) a mounting head having a plurality of suction nozzles for picking up a plurality of components from said feeder carriage;
   (c) image capturing means for taking an image of each component held by said suction nozzles after said plurality of suction nozzles have picked up said plurality of components; and
   (d) a recognizer for sequentially recognizing each component using image data obtained by said image capturing means according to a mounting sequence of each component;
   wherein a recognized component is individually mounted on a mounting target in turn.

2. The component mounter as defined in claim 1, wherein said image capturing means is a line camera, and said mounting head moves to said line camera for obtaining the image data.

3. The component mounter as defined in claim 1, wherein a positional deviation of said recognized component is corrected, and then individually mounted on a mounting target in turn.

4. The component mounter as defined in claim 1, wherein a position of a next component is recognized while mounting said recognized component.

5. The component mounter as defined in claim 1, wherein suction error detection is implemented for detecting the presence of a component on each of said suction nozzles before recognizing each of said components.

6. The component mounter as defined in claim 5, wherein said suction error detection is implemented using an image taken by said image capturing means.

7. The component mounter as defined in claim 5, wherein positional recognition and mounting are abandoned for a particular suction nozzle in which a suction error is found in said suction error detection.

8. A component mounting method comprising:
   (a) picking up a plurality of components from a component feeder carriage by a mounting head having a plurality of suction nozzles;

(b) taking an image of each component held by said suction nozzles, by image capturing means, after said plurality of suction nozzles have picked up said plurality of components;

(c) sequentially recognizing each component by a recognizer using said image taken according to a mounting sequence of each component; and (d) mounting the recognized component individually on a mounting target in turn.

9. The component mounting method as defined in claim 8, wherein a line camera is used as said image capturing means in said step of taking an image of each component, and image data is obtained by moving said mounting head to said line camera.

10. The component mounting method as defined in claim 8 further comprising next steps after said step of recognizing each component:

calculating compensation for correcting positional deviation of said each component; and correcting positional deviation according to said compensation for correcting positional deviation while moving said mounting head.

11. The component mounting method as defined in claim 8, wherein a position of a next component is recognized during mounting of said recognized component.

12. The component mounting method as defined in claim 8 further comprising a next step before said step of recognizing each component: detecting a suction error for checking the presence of the component on each of said suction nozzles.

13. The component mounting method as defined in claim 12, wherein said step of suction error detection is implemented using the image taken by said image capturing means.

14. The component mounting method as defined in claim 12, wherein position recognition and mounting are abandoned for a particular suction nozzle in which a suction error is found in said step of detecting a suction error.

* * * * *